United States Patent [19]

Hayashi et al.

[11] Patent Number: 4,616,340
[45] Date of Patent: Oct. 7, 1986

[54] NON-VOLATILE SEMICONDUCTOR MEMORY

[75] Inventors: Yutaka Hayashi, Sakuramura; Yoshikazu Kojima, Tokyo; Masaaki Kamiya, Tokyo; Kojiro Tanaka, Tokyo, all of Japan

[73] Assignees: Agency of Industrial Science & Technology; Kabushiki Kaisha Daini Seikosha, both of Tokyo, Japan

[21] Appl. No.: 431,304

[22] Filed: Sep. 30, 1982

[30] Foreign Application Priority Data

Oct. 14, 1981 [JP] Japan ............................ 56-163583

[51] Int. Cl.$^4$ ................................................ G11C 7/00
[52] U.S. Cl. ..................................... 365/185; 365/189; 357/23.5
[58] Field of Search ............... 365/185, 218, 184, 189; 357/23.5, 84

[56] References Cited

U.S. PATENT DOCUMENTS

| 4,099,196 | 7/1978 | Simko ............................ 365/218 |
| 4,200,841 | 4/1980 | Nagata et al. .................. 365/185 |
| 4,328,565 | 5/1982 | Harari ............................ 365/185 |
| 4,412,311 | 10/1983 | Miccoli et al. ................. 365/185 |

FOREIGN PATENT DOCUMENTS

| 0051158 | 5/1982 | European Pat. Off. ............ 365/185 |
| 0060408 | 9/1982 | European Pat. Off. ............ 365/185 |

Primary Examiner—James W. Moffitt
Assistant Examiner—Glenn A. Gossage
Attorney, Agent, or Firm—Robert E. Burns; Emmanuel J. Lobato; Bruce L. Adams

[57] ABSTRACT

In the non-volatile semiconductor memory of present invention, a select gate and a floating gate are formed on the surface portion of the substrate between a source region and the drain region also acting as a control gate through a gate oxide film. A part of a channel current is injected into the floating gate at the surface portion under the edge of the floating gate covered by the select gate.

8 Claims, 13 Drawing Figures

NON-VOLATILE SEMICONDUCTOR MEMORY

BACKGROUND OF THE INVENTION

The present invention relates to a MOS type non-volatile semiconductor memory with a floating gate electrode.

An electric charge injection method from a semiconductor substrate to a floating gate electrode in relation to a conventional channel injection-type non-volatile semiconductor memory is explaned with FIG. 1a, FIG. 1b, FIG. 1c and FIG. 2. FIG. 1a is a plan view of a conventional lucky electron injection type non-volatile semiconductor memory, FIG. 1b is a sectional view taken on line A—A' of FIG. 1a, and FIG. 1c is an equivalent circuit of this memory.

The following is an electric carrier injection method of a N-type memory transistor. In FIGS. 1a, b, a N+ type source region 2 and drain region 3 are formed at some space adjacent to a surface of a P-type semiconductor substrate 1, and a second gate insulator 4 and a third gate insulator 5 are each formed on two channel regions $l_1$ and $l_2$ between the source region 2 and the drain region 3, and a floating gate electrode 7 is formed on the third gate insulator 5 and a first gate insulator 6 provided on the drain region 3, and then a select gate electrode 8 is formed on the second gate insulator 4.

A write operation (electric carrier injection from the semiconductor substrate I to the floating gate electrode 7) is done in the following manner.

The floating gate electrode 7 is capacitance coupled with the circumferential electrode and regions as shown FIG. 1c. In FIG. 1c, $V_{SG}$ is the voltage of the select gate electrode 8, $V_D$ is the voltage of the drain electrode 3a, $V_F$ is the voltage of the floating gate electrode 7 and, Vsub is the voltage of the semiconductor substrate 1. Usually, Vsub=0 because the voltage of the semiconductor substrate 1 becomes the ground potential for all electrodes. $C_{SG}$ is the capacitance between the floating gate electrode 7 and the select gate electrode 8, and $C_D$ is the capacitance between the floating gate electrode 7 and the drain electrode 3a, and Csub is the capacitance between the floating gate electrode 7 and the semiconductor substrate 1.

$C_D$ $C_{SG}$, Csub are realized clearly due to the structure as shown in FIGS. 1a, b.

Therefore, the following equation is given always.

$$V_F \approx V_D \quad (1)$$

By applying large drain voltage, the channel region $l_2$ below the floating gate electrode 7 can be inverted strongly and the surface potential of the channel region $l_2$ is almost the same as the drain voltage $V_D$. Namely, the band structure of the sectional view on line c—c' of FIG. 1b can be drawn as shown FIG. 2. The potential distribution is bent at the surface of channel region $l_2$.

According to the equation (1), the surface potential $\phi_S$ is given approximately by the equation (2).

$$\phi_S \approx V_D \quad (2)$$

Namely, flowing the forward current from the source region 2 to the semiconductor substrate 1 when the channel region $l_1$ is not inverted, a part of the forward current can be injected from the semiconductor substrate 1 to the floating gate electrode 7 along an arrow D of FIG. 2. Such electric carriers injection method is called lucky-electron injection.

To inject the carriers to the floating gate electrode 7, the following equation must be realized clearly due to FIG. 2.

$$\phi_S > \phi_C \quad (3)$$

where $\phi_C$ is the barrier energy of the semiconductor substrate 1—the third gate insulator 5. When the semiconductor substrate 1 is made of Si and the third gate insulator 5 is made of $SiO_2$, $\phi_C$ is about 3.2 V.

Normally, the electrons in semiconductor substrate 1 decrease in energy due to collisions during the bulk electron flow to the floating gate electrode 7. The electrons with an energy which satisfies eq.(3) at the surface of the channel region $l_2$ can be injected to the floating gate electrode 7. In the case of lucky-electron injection type memory because the doping density of the semiconductor substrate 1 is high and the width of the depletion layer at the surface is short, the energy loss due to collision is reduced.

FIG. 3 shows the minimum drain voltage $V_{WO}$ to inject electrons from the semiconductor substrate 1 to the floating gate electrode 7 (minimum write voltage) as a function of the doping density of the semiconductor substrate 1 in the case of that the gate insulator is 200 Å $SiO_2$.

The minimum write voltage $V_{WO}$ can be decreased by increasing the doping density $N_A$. FIG. 4 shows the write characteristics of a memory as functions of the length of channel region $l_1$. The threshold voltage shift of the channel region $l_2$ is the difference between the initial threshold voltage and the threshold voltage after write. And $I_D$/Iinj is the ratio of drain current $I_D$ to injection current Iin; flowed from the source region 2 to the semiconductor substrate 1. The electrons injected to the floating gate electrode 7 increase with drain current. $\Delta V_T$ increases with the injected electrons and $I_D$/Iinj decreases with useless injection current.

The injection efficiency of electrons depends strongly on the length of channel region $l_1$ as shown in FIG. 4. $I_D$/Iinj decreases with the length of channel region $l_1$. Therefore the electrons which flow from the source region 2 to the semiconductor substrate 1 can be injected efficiently to the floating gate electrode 7 in the case of a memory with a short channel region $l_1$. But few electrons can be injected to the floating gate electrode in the case of a memory with a long channel region $l_1$.

Therefore, reciprocal action between multiple memories is strong when the distance between the memory and a next memory is short because the inject current can flow to the nonselected memory.

As the above explanation, a bipolar-lucky-electron injection type memory with forward current has the following weak points.

(1) Two voltage sources with different polarity are needed to write information in each memory because the write operation needs the forward current.
(2) A large current is needed to write information in each memory because the write operation needs the forward current and the injection efficiency is low.
(3) The reciprocal action between multiple memories is strong because a forward current is used.
(4) The breakdown voltage of the source and drain regions is low because the doping density is high.

(5) Multiple memories do not have uniform characteristics because the memory characteristics depend strongly on the pattern of the memory.

Therefore, a bipolar-electron-injection type memory is not useful even though there is a good characteristic in that the write voltage is low.

SUMMARY OF THE INVENTION

It is an object of the present invention to provide a lucky-electron-injection type non-volatile semiconductor memory without forward current suitable for a high density integrated memory.

BRIEF DESCRIPTION OF THE DRAWINGS

FIG. 5a is a sectional view showing an embodiment of a non-volatile memory according to the present invention, FIG. 6b, is a sectional view taken on line E—E' of FIG. 6a, FIG. 8a is a plan view showing an embodiment of a channel-lucky-electron-injection type non-volatile semiconductor memory with a shield electrode according to the present invention and, FIG. 8b is a sectional view taken on line G—G' of FIG. 8a.

DETAILED DESCRIPTION OF PREFERRED EMBODIMENTS

The channel-lucky-electron-injection type non-volatile semiconductor memory with floating gate electrode according to the present invention will be illustrated with respect to its structure, memory writing (programming) method, reading method, and erasing method.

The structure of a memory according to the present invention is almost the same with the bipolar-lucky-electron-injection type memory.

Therefore, using the structure of the bipolar-lucky-electron-injection type memory, the writing method according to the present invention will be illustrated.

Figure 1A:
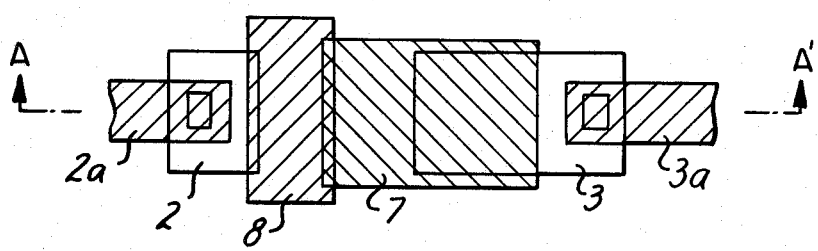
FIG. 1a is a plan view showing an embodiment of a conventional bipolar-lucky-electron-injection type non-volatile semiconductor memory.
Figure 1B:
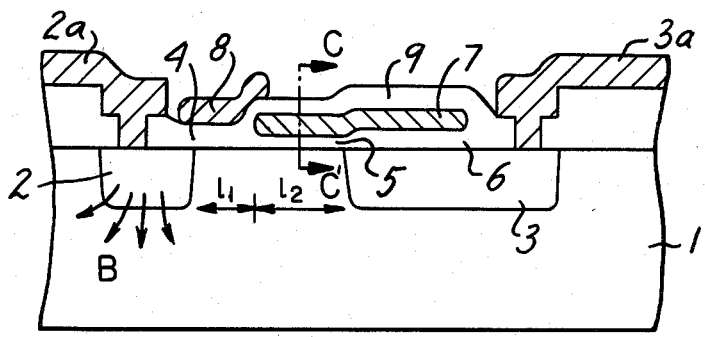
FIG. 1b is a sectional view taken on line A—A' of FIG. 1a, FIG. 1c is an equivalent circuit of the memory of FIGS. 1a, b.
Figure 1C:
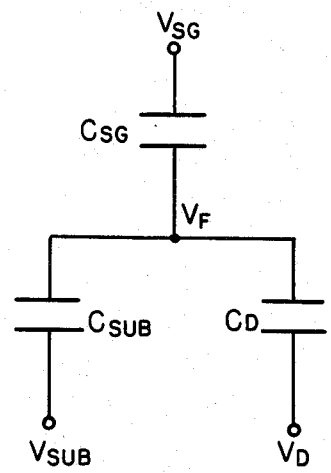
Figure 2:
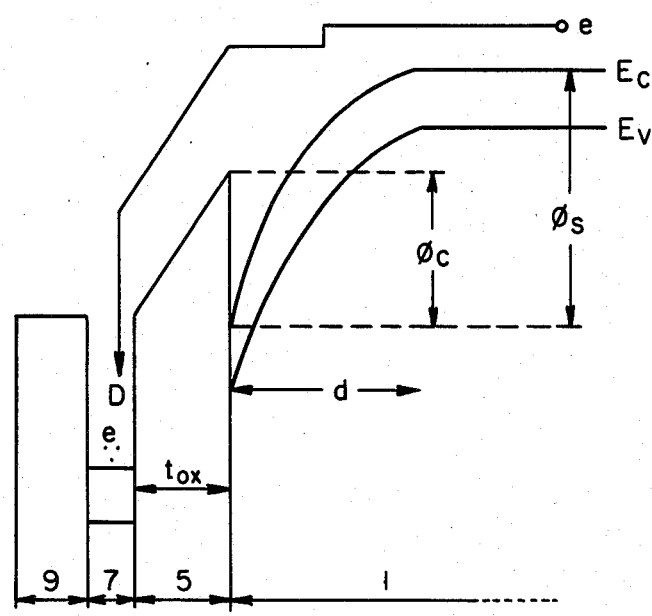
FIG. 2 shows the band diagram of the sectional view on line C—C' of FIG. 1b.
Figure 3:
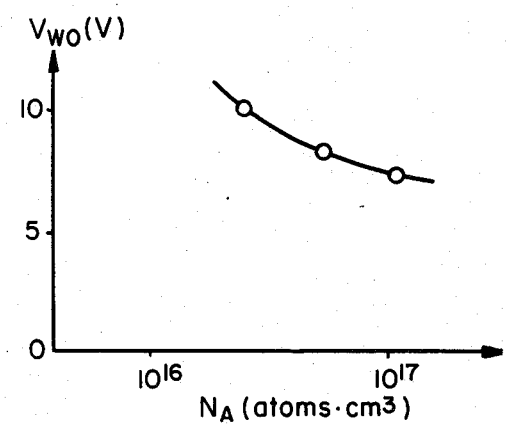
FIG. 3 shows the minimum write voltage of the conventional memory as functions of the doping density of the semiconductor substrate.
Figure 4:
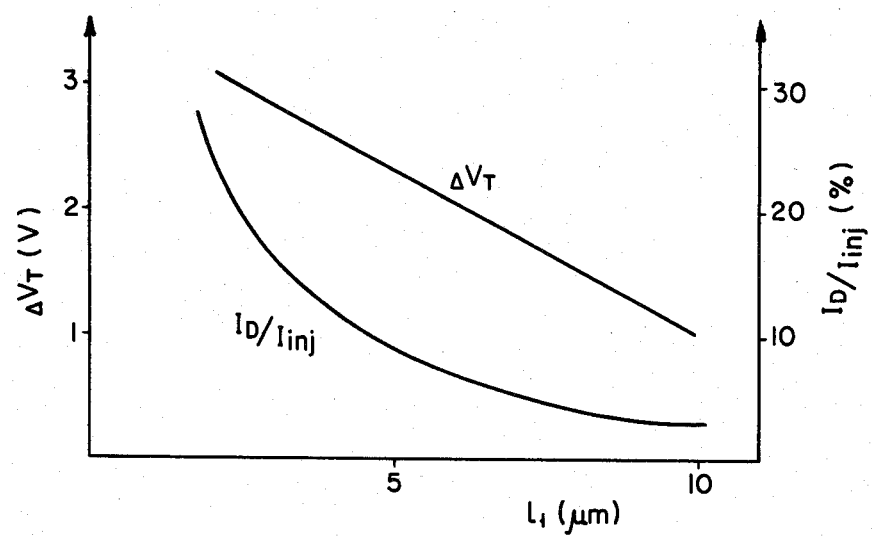
FIG. 4 shows the write characteristics of the conventional bipolar-lucky-electron-injection type non-volatile memory as a function of the length of channel region $l_1$.
Figure 5A:
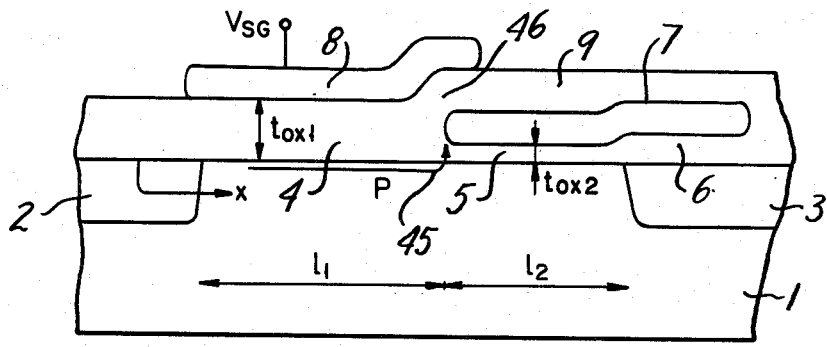
FIGS. 5a, b are diagrams to explain the operating principle of a channel-lucky-electron-injection type non-volatile semiconductor memory according to the present invention.
Figure 5B:
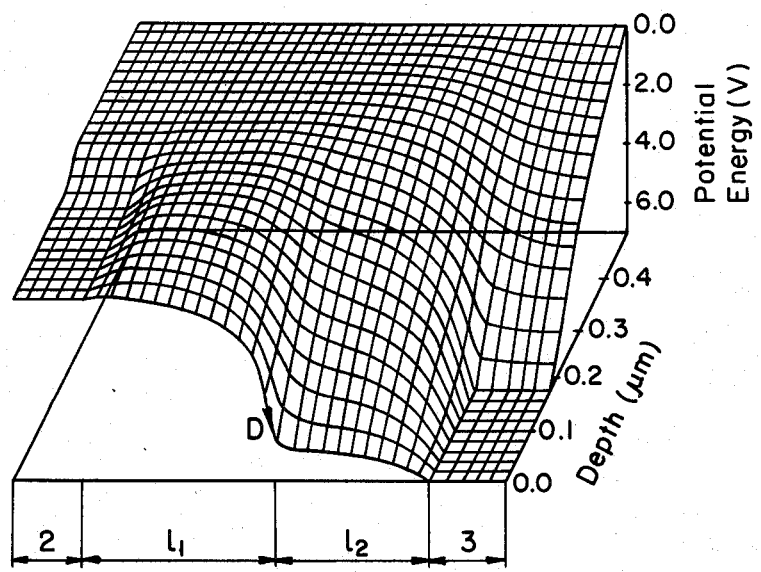
FIG. 5b shows a secondary dimension potential distribution diagram on the surface of channel region $l_1$ and $l_2$ between the source region 2 and the drain region 3.

FIG. 5a is a sectional view showing an embodiment of a non-volatile memory according to the present invention. FIG. 5b shows a two dimensional potential distribution diagram on the surface of channel region $l_1$ and $l_2$ between the source region 2 and the drain region 3.

The select gate voltage $V_{SG}$ is applied to the select gate electrode 8 to invert the channel region $l_1$ and the drain voltage $V_D$ is applied to the drain region 3 to invert the channel $l_2$. When the channel $l_1$ and $l_2$ is inverted, the channel carriers can flow from the source region 2 to the drain region 3. In the case of a writing operation, a large drain write voltage $V_{DW}$ is applied to the drain region 3 to strongly invert the channel $l_2$ and a select gate write voltage $V_{SGW}$ is applied to the select gate electrode 8 to weakly invert the channel $l_1$ so as to satisfy the following relations:

$$V_{SGW} - V_{THSG} < V_{FW} - V_{THF},$$

$$\phi_C < V_{FW} - V_{THF},$$

$$\phi_C < V_{DW}$$

where, $V_{SGW}$ is the select gate write (programming) voltage, $V_{THSG}$ is the threshold voltage of the select gate,
$V_{FW}$ is the floating gate write voltage,
$V_{THF}$ is the threshold voltage of the floating gate,
$\phi_C$ is the barrier energy potential of the interface between the semiconductor substrate 1 and the third gate insulator 5, and $V_{DW}$ is the drain write voltage. The potential distribution of electrons near the surface of the channel $l_1$ and $l_2$ is shown as FIG. 5b. Namely, a sharp potential slope is formed on the semiconductor surface at the interface where the channel region $l_1$ meets the channel region $l_2$.

If the potential difference at this surface is smaller than the barrier energy of the substrate 1 to the gate insulator 5 (when the substrate 1 is made of Si and the gate insulator 5 is made of SiO$_2$, $\phi_C$ is about 3.2 V.), the electrons flowing from the source region 2 are accelerated by the electric field having the surface potential difference according to an arrow D in FIG. 5b and are injected to the drain region 3. If the relation $V_D > \phi_C$ is satisfied, the electrons flowing from the source region 2 are accelerated more strongly by the electric field and a part of the electrons can be injected to the floating gate electrode 7 through the third gate insulator 5.

FIG. 5b is a two-dimensional potential distribution diagram where the substrate 1 is P type Si with $5 \times 10^{16}$ atoms cm$^{-3}$ doping density and the gate insulator is made of SiO$_2$ and the oxide thickness $t_{ox1}$ is 800 Å and $t_{ox2}$ is 60 Å and the drain voltage $V_D$ is 6 V and the floating gate voltage $V_F$ is 6 V. Namely, lucky-electron-injection can be carried out due to the channel current in this structure, because the surface potential difference $V_{FW} - V_{THF}$ on the surface on which the channel region $l_1$ meets the channel region $l_2$ is higher than the barrier energy $\phi_C$—namely, $\phi_C < V_{FW} - V_{THF}$. The electrons can be injected to the floating gate electrode 7 where the channel region $l_1$ meets the channel region $l_2$ in the channel-lucky-electron-injection type memory. The channel electrons are injected to the floating gate electrode 7 at the middle of the channel region between the source region 2 and the drain region 3.

As understood from the above explanation, a channel-lucky-electron injection type memory of the present invention has the following good features because the channel current is used to inject the electrons to the floating gate electrode.

(1) Only one voltage source is needed to write in this memory.

(2) The electrons can be injected to the floating gage electrode by a small drain current.

(3) The isolation among each of the memory cells is simple.

(4) The injection efficiency of the channel-lucky-electron-injection memory depends on the substrate doping density to a lesser degree than that of the bipolar-lucky-electron-injection memory because the electrons are accelerated by the electric field parallel to the channel plane.

(5) A low threshold voltage of the select gate electrode is possible.

(6) The dependence on the pattern of the injection efficiency is small.

As a consequence, the memory of the present invention is very much better than the bipolar-lucky-electron-injection type memory which uses the forward current for the write operation.

A method of reading the non-volatile semiconductor memory according to the present invention will be described.

A memory can be read and its content determined according to the measurement of the channel current when the channel region $l_1$ below the select gate electrode 8 is inverted by applying the select gate read voltage $V_{SGR}$ to the select gate electrode 8 so as to satisfy the relation $V_{SGR} \geq V_{SGW}$ and the drain read voltage $V_{DR}$ is applied to the drain region 3. The channel is hard to be inverted when the number of electrons in the floating gate electrode 7 is large, while the channel is easily inverted when the number of electrons in the floating gate electrode 7 is small.

Namely, a memory can be read and its content determined according to the measurement of the channel current because the channel current flows in response to the amount of electrons in the floating gate electrode 7.

Subsequently the methods of erasing electrons from the floating gate electrode will be illustrated.

One method is exciting the electrons in the floating gate electrode by irradiation with ultraviolet rays causing escaping of the electrons to the silicon substrate. The other method is the application of a high voltage to some electrode which has a capacitance coupling with the floating gate electrode and the tunnel current flows through the insulator between the erase electrode and the floating gate electrode and the electrons flow from the floating electrode to the erase electrode.

The former method is popular. Accordingly the latter method will be illustrated in conjunction with the drawings.

In the case of the memory shown FIG. 5a, the electrons can flow from the floating gate electrode 7 to the select gate electrode 8. The capacitance coupling of the drain region 3 with the select gate electrode 8 and with the floating gate electrode 7 is small. Therefore, the plus high erase voltage compared with the drain voltage is applied to the select gate electrode 8 and then the plus high erase voltage is almost applied to the insulator 46 between the floating gate electrode and the select gate electrode.

When the erase voltage is applied to the insulator 46 a tunnel current can flow through the insulator 46 from the floating gate electrode 7 to the select gate electrode 8.

Namely, the electrons in the floating gate electrode 7 can escape from the floating gate electrode 7 to the select gate electrode 8 and the erasing operation can be carried.

Figure 6A:
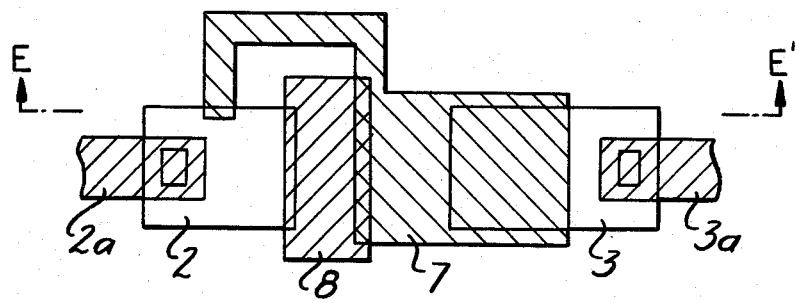
FIG. 6a, FIG. 7 are plan views showing embodiments of electrically erasable non-volatile semiconductor memory according to the present invention.
Figure 6B:
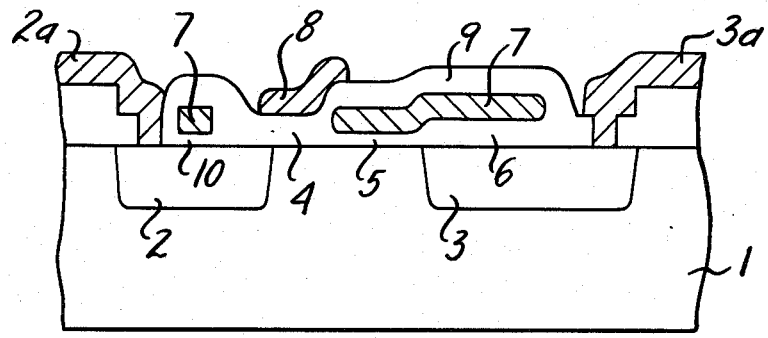

In a memory having the structure according to the present invention shown in FIGS. 6a, b, the electrons of the floating gate electrode 7 can escape electrically from the floating gate electrode 7 to the source region 2. There is capacitance coupling of the source region 2 with the floating gate electrode 7 because the source region 2 overlaps with the floating gate electrode 7 through the thin gate oxide. When the overlapped area between the source region 2 and the floating gate electrode 7 is small, the capacitance coupling is small. Therefore if the erase voltage is applied to the source region 2 when the drain voltage is $0_V$, the erase voltage is applied to the thin insulator 10. As a result, the tunnel electrons can flow from the floating gate electrode 7 to the source region 2. In the case that the thin insulator 10 is 100 Å $SiO_2$, the electrons can escape to the source region 2 by an erase voltage less than 10 V.

Figure 7:
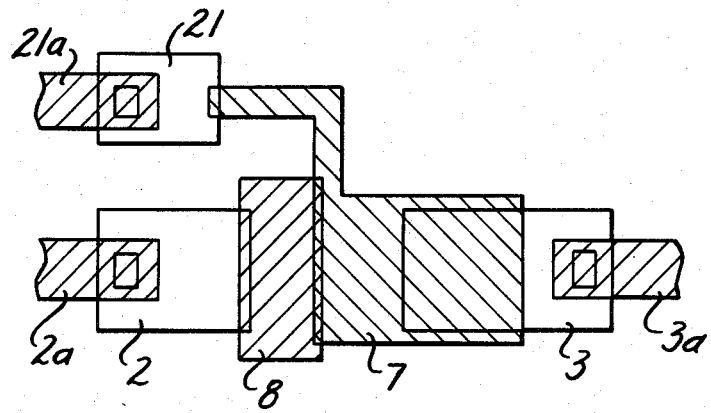

In a memory having the structure according to the present invention shown in FIG. 7, the electrons of the floating gate electrode 7 can electrically escape from the floating gate electrode 7 to the erase electrode 21. In this structure the N type erase electrode 21 is formed on the surface of P type substrate and the floating gate electrode is formed on the N type erase electrode through a thin insulator. The floating gate electrode 7 has the small capacitance coupling with the erase electrode 21. Therefore when the erase voltage is applied to the erase electrode 21, the tunnel electrons can flow from the floating gate electrode 7 to the erase electrode 21. Thus the non-volatile semiconductor memory according to the present invention is able to erase electrically.

The structure to erase electrically has been explained. The voltages of every electrode must be applied to each electrode so as not to flow a large drain current between the source region 2 and the drain region 3 in the non-volatile semiconductor memory according to the present invention when the electrons of the floating gate electrode are erased electrically.

Figure 8A:
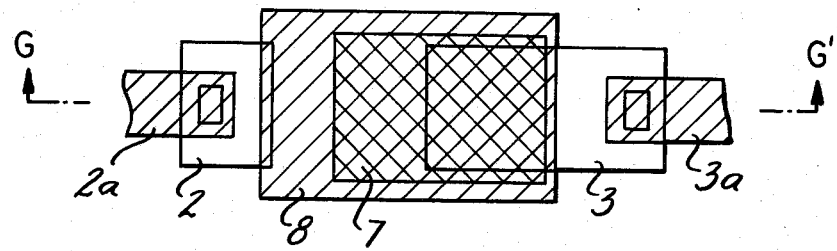
Figure 8B:
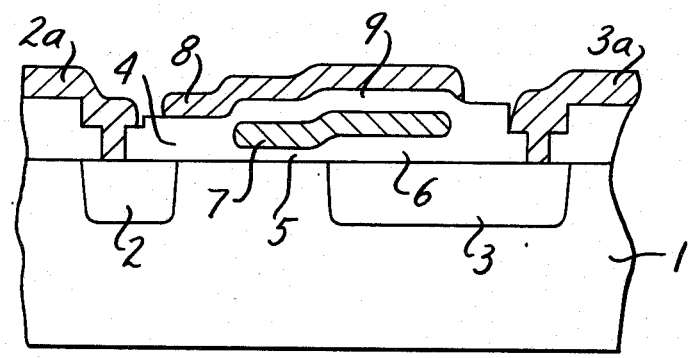

By the way, normally the drain current of the non-volatile semiconductor memory according to the present invention changes with time. The reason for this phenomenon is that the floating gate electrode is not shielded perfectly and consequently the voltage of the floating gate electrode is easy to be changed by an external electric field. To remedy this a shield electrode 8 is formed on the floating gate electrode 7 through the gate insulator 9 to prevent change of the drain current. FIGS. 8a and b show an embodiment of a section of a non-volatile semiconductor memory with the shield electrode 8 according to the present invention. FIG. 8a is a plan view and FIG. 8b is a sectional view taken on line G—G' of FIG. 8a. Normally the voltage of the shield electrode is the same to any electrode. The voltage of the shield electrode is the same as the select gate electrode 8 in the structure shown by FIGS. 8a, b. If the shield electrode and the select gate electrode are made by the same process, the structure of the memory is shown as FIG. 8.

As understood from the above explanation, a channel-lucky-electron-injection type non-volatile semiconductor memory enables not only the low voltage programming that is the good characteristic of bipolar-lucky-electron-injection type non-volatile semiconductor memory but also the simple programming method and the low power programming and the high degree of integration memory.

Every embodiment of a non-volatile semiconductor memory used to illustrate the present invention is an N type MOS transistor formed on a P type semiconductor substrate. However, a P type MOS memory transistor can be formed also on an N type semiconductor substrate to carry out the invention. Then the memory transistor can be made on the semiconductor layer formed on the insulator substrate.

What is claimed:

1. A non-volatile semiconductor memory device comprising: a semiconductor substrate; a source region and drain region disposed in spaced apart isolation from one another adjacent to the surface of said semiconductor substrate; a first gate insulating layer on said drain region; a channel extending between said source region and said drain region, the channel consisting of a first channel region and a second channel region in contact with one another, the second channel region being in contact with the drain region; a second gate insulating layer on said first channel region; a third gate insulating layer on the second channel region; a floating gate electrode on said first and third gate insulating layers; a select gate electrode on said second gate insulating layer; and means operable in a write mode for applying a drain write voltage $V_{DW}$ of one polarity to said drain region and for applying a select gate write voltage $V_{SGW}$ of said one polarity to said select gate electrode in order to write in the memory and operable in a read mode for applying a drain read voltage $V_{DR}$ of said one polarity to said drain region and for applying a select gate read voltage $V_{SGR}$ of said one polarity to said select gate electrode in order to read out the memory by detecting the drain current dependent on electric charges memorized in the floating gate electrode so as to satisfy the following relations:

$$V_{SGR} \geq V_{SGW}, \text{ and}$$

$$\phi_S > \phi_C$$

where $\phi_S$ represents the surface potential of said semiconductor substrate, and $\phi_C$ represents the barrier energy potential between said semiconductor substrate and said third gate insulating layer in order to accelerate electrons escaping from said source region and inject some of the accelerated escaping electrons into said floating gate electrode at a position where said first and second channel regions make contact with one another, said position being located sufficiently far from the drain region so as to greatly increase the number of accelerated escaping electrons injected into said floating gate.

2. A non-volatile semiconductor memory device comprising: a semiconductor substrate; a source region and drain region disposed in spaced apart isolation from one another adjacent to the surface of said semiconductor substrate; a first gate insulating layer on said drain region; a channel extending between said source region and said drain region, the channel consisting of a first channel region and a second channel region in contact with one another, the second channel region being in contact with the drain region; a second gate insulating layer on said first channel region; a third gate insulating layer on said second channel region; a floating gate electrode on said first and third gate insulating layers; a select gate electrode on said second gate insulating layer; and means for applying a drain write voltage $V_{DW}$ of one polarity to said drain region to strongly invert said second channel region and for applying a select gate write voltage $V_{SGW}$ of said one polarity to said select gate electrode to weakly invert said first channel region in comparison to that of said second channel region so as to satisfy the following relations:

$$V_{SGW} - V_{THSG} < V_{FW} - V_{THF},$$

$$\phi_C < V_{FW} - V_{THF}, \text{ and}$$

$$\phi_C < V_{DW}$$

where $V_{THSG}$ represents the threshold voltage of said select gate electrode, $V_{FW}$ represents the floating gate write voltage, $V_{THF}$ represents the threshold voltage of said floating gate electrode, and $\phi_C$ represents the barrier energy voltage between said semiconductor substrate and said third gate insulating layer in order to accelerate electrons escaping from said source region and inject some of the accelerated escaping electrons into said floating gate electrode at a position where said first and second channel regions make contact with one another, said position being located sufficiently far from the drain region so as to greatly increase the number of accelerated escaping electrons injected into said floating gate.

3. A non-volatile semiconductor memory device as claimed in claim 2, wherein the source region and drain region extend a certain depth into the semiconductor substrate; and the position where the first channel region makes contact with the second channel region is spaced from the drain region a distance greater than said certain depth.

4. A non-volatile semiconductor memory as claimed in claim 2 or 1, wherein said floating gate electrode overlaps in part with said select gate electrode with an insulator therebetween; and said means for applying includes means operable in an erase mode for applying a voltage of said one polarity to said select gate electrode in order to erase the memory by discharging electric charges from said floating gate electrode.

5. A non-volatile semiconductor memory as claimed in claim 2 or 1, wherein said floating gate electrode overlaps in part with said source region with a fourth gate insulator therebetween and said means for applying includes means operable in an erase mode for applying a voltage of said one polarity to said source region in order to erase the memory by discharging electric charges from said floating gate electrode.

6. A non-volatile semiconductor memory as claimed in claim 2 or 1, wherein said floating gate electrode overlaps with a secondary electro-conductive erase region in said semiconductor substrate with a fifth gate insulator therebetween; and said means for applying includes means operable in an erase mode for applying a voltage of said one polarity to said erase region in order to erase the memory by discharging electric charges from said floating gate electrode.

7. A non-volatile semiconductor memory as claimed in claim 2 or 1, wherein a shield electrode is formed on said floating gate electrode with a sixth gate insulator therebetween.

8. A non-volatile semiconductor memory as claimed in claim 7, including means for maintaining the voltage of said shield electrode the same as the voltage of said select gate electrode.

* * * * *